United States Patent [19]
Mallinson et al.

[11] Patent Number: 5,872,470
[45] Date of Patent: Feb. 16, 1999

[54] PIPELINED SAMPLE AND HOLD CIRCUIT WITH CORRELATED DOUBLE SAMPLING

[75] Inventors: Martin Mallinson, British Columbia, Canada; Max J. Allen, Cupertino; Richard E. Colbeth, Los Altos, both of Calif.

[73] Assignee: Varian Associates, Inc., Palo Alto, Calif.

[21] Appl. No.: 758,536

[22] Filed: Nov. 29, 1996

[51] Int. Cl.[6] .................................................. G11C 27/02
[52] U.S. Cl. ................................ 327/94; 327/95; 327/96
[58] Field of Search ................................ 327/91, 93, 94, 327/95, 96, 337, 554; 341/122–125

[56] References Cited

U.S. PATENT DOCUMENTS

| | | | |
|---|---|---|---|
| 4,804,863 | 2/1989 | Welland et al. | 327/91 |
| 5,159,341 | 10/1992 | McCartney et al. | 341/143 |
| 5,331,222 | 7/1994 | Lin et al. | 327/337 |
| 5,363,055 | 11/1994 | Ribner | 327/337 |

*Primary Examiner*—My-Trang Nu Ton
*Attorney, Agent, or Firm*—Hunter L. Auyang

[57] ABSTRACT

A signal sampling circuit for performing correlated double sampling (CDS) of an input signal with a pipelined sample and hold architecture includes a time multiplexed integrating amplifier circuit in which the output circuit is a pipelined sample and hold circuit which provides time multiplexed input signal samples and the feedback integration capacitor is discharged between samples. At all times, one of the channels of the pipelined sample and hold circuit is providing one of the time multiplexed input signal samples while the other channel continues tracking the input signal. The feedback integration capacitor acts as a clamp to null out residual reset noise received as part of the input signal to be sampled. Hence, with the exception of that very brief period of time necessary for switching between the two pipelined sample and hold circuit channels, one of the two pipelined sample and hold circuit channels is always available for signal acquisition.

13 Claims, 4 Drawing Sheets ures pipelined sample and hold circuits, and in particular, to pipelined sample and hold circuits with correlated double sampling.

PIPELINED SAMPLE AND HOLD CIRCUIT WITH CORRELATED DOUBLE SAMPLING

FIELD OF THE INVENTION

The present invention relates to sample and hold circuits, and in particular, to pipelined sample and hold circuits with correlated double sampling.

BACKGROUND OF THE INVENTION

Sample and hold circuits play an important role in data acquisition systems, particularly in those systems in which the signals containing the data of interest are changing faster than the system can acquire and appropriately process the data.

For example, in large area, flat panel imaging systems, such as imaging systems for medical and document imaging applications based upon amorphous silicon, the image sensor is typically arranged as an array of pixels, each of which consists of a photosensitive element and a thin film transistor (TFT). In order to achieve imaging frame rates suitable for video processing and display, all gate and data line connections for the sensor are brought out to the edge of the array for connection to an off-array control circuit containing row selection and charge sensing circuitry. For a high resolution array, many pixels are used for each data line, with the result being a high data readout rate in order to sample each of the pixels within the time constraints of the real time video display. Accordingly, while the data for each pixel must be sampled accurately, it must also be sampled quickly and held available for a sufficient period of time to allow the pixel data to be appropriately processed, stored, etc.

However, such image data signals, due to the manner in which they are generated, include, in addition to the image component, a noise component which is generated as a result of the image array scanning process. For example, the circuitry used to acquire the image data information from each pixel typically includes a charge sensitive pre-amplifier which must be reset between each pixel. This resetting of the charge sensitive pre-amplifier immediately prior to reading out the charge from each pixel generates a significant, and undesirable, noise component which, if not eliminated during the sample and hold process, will significantly distort and obscure the true image information corresponding to that pixel.

Accordingly, it would be desirable to have a sample and hold circuit which is capable of eliminating the noise component from the signal to be sampled.

SUMMARY OF THE INVENTION

In accordance with the present invention, correlated double sampling (CDS) is provided in a pipelined sample and hold circuit architecture. Such a circuit can be used advantageously in multiple channel, charge sensitive readout circuits in which multiple data channels of a sensor are each connected to a charge sensitive pre-amplifier. In such an application, the CDS eliminates the noise associated with resetting the charge sensitive pre-amplifier, while the sample and hold circuitry allows the data from a previous channel to be read out during sampling of the present channel. By using a pipelined sample and hold architecture, maximum data sampling time, or "line time," is available for reading out the sampled data. Hence, only a very small portion of each pixel period is required for data transfer, leaving a significantly larger portion of the pixel period available for the charge sensitive pre-amplifier to acquire new data.

Additionally, multiple pipelined sample and hold circuits with correlated double sampling in accordance with the present invention can be interconnected via an array of switches for purposes of combining, or "binning," data from multiple charge sensitive pre-amplifiers, while providing the CDS function for the resulting composite data signal from the interconnected pre-amplifiers.

More specifically, in accordance with one embodiment of the present invention, a signal sampling circuit for performing correlated double sampling (CDS) of an input signal with a pipelined sample and hold architecture includes a capacitive input circuit, a differential amplifier, a pipelined sample and hold circuit and a capacitive feedback circuit. The capacitive input circuit is configured to receive an input signal, which includes a desired signal component and an undesired signal component, and in accordance therewith provide a capacitively coupled input signal. The differential amplifier is coupled to the capacitive input circuit, includes first and second input terminals and an output terminal, and is configured to receive the capacitively coupled input signal and a reference voltage via the first and second input terminals, respectively, and in accordance therewith provide an amplified signal via the output terminal. The pipelined sample and hold circuit is coupled to the differential amplifier output terminal and is configured to receive a plurality of sampling control signals and in accordance therewith receive, sample and hold the amplified signal and in accordance therewith provide first and second pluralities of time multiplexed input signal samples. Respective temporally adjacent ones of the first and second pluralities of time multiplexed input signal samples and temporally coincident ones of the first and second pluralities of time multiplexed input signal samples represent temporally adjacent samples of the input signal. The capacitive feedback circuit is coupled between the pipelined sample and hold circuit and the first differential amplifier input terminal and is configured to receive a feedback control signal and in accordance therewith receive the first plurality of time multiplexed input signal samples. The first and second pluralities of time multiplexed input signal samples include the desired signal component and exclude the undesired signal component.

In accordance with another embodiment of the present invention, a signal sampling circuit for performing correlated double sampling (CDS) of an input signal with a pipelined sample and hold architecture includes a capacitive input circuit, a differential amplifier, a pipelined sample and hold circuit and a capacitive feedback circuit. The capacitive input circuit is configured to receive an input signal, which includes a desired signal component and an undesired signal component, and in accordance therewith provide a capacitively coupled input signal. The differential amplifier is coupled to the capacitive input circuit, includes first and second input terminals and an output terminal, and is configured to receive the capacitively coupled input signal and a reference voltage via the first and second input terminals, respectively, and in accordance therewith provide an amplified signal via the output terminal. The pipelined sample and hold circuit is coupled to the differential amplifier output terminal and is configured to receive one or more sampling control signals and in accordance therewith receive, sample and hold the amplified signal and in accordance therewith provide a plurality of input signal samples and to time multiplex the plurality of input signal samples and in accordance therewith provide a first plurality of time multiplexed input signal samples. Temporally coincident ones of the plurality of input signal samples and temporally adjacent ones of the first plurality of time multiplexed input signal samples represent temporally adjacent samples of the input signal. The capacitive switching feedback circuit is coupled between the pipelined sample and hold circuit and the first differential amplifier input terminal and is configured to receive a plurality of feedback control signals and the plurality of input signal samples and in accordance therewith time multiplex the plurality of input signal samples and in accordance therewith provide a second plurality of time multiplexed input signal samples and to charge and discharge in accordance therewith. The first and second pluralities of time multiplexed input signal samples include the desired signal component and exclude the undesired signal component.

These and other features and advantages of the present invention will be understood upon consideration of the following detailed description of the invention and the accompanying drawings.

DETAILED DESCRIPTION OF THE INVENTION

Figure 1:
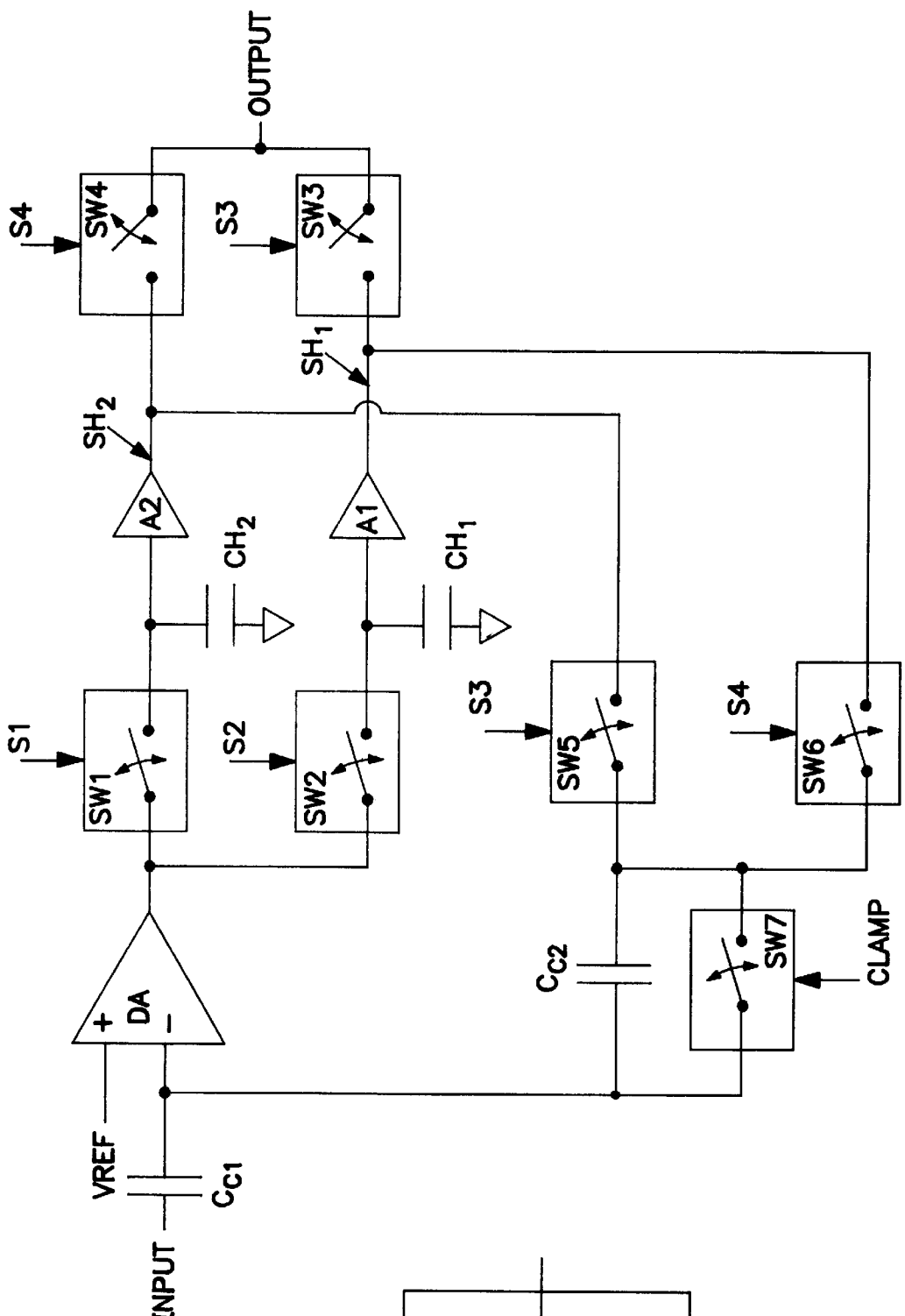
FIG. 1 is a schematic diagram of a pipelined sample and hold circuit with correlated double sampling in accordance with one embodiment of the present invention.

Referring to FIG. 1, a pipelined sample and hold circuit with correlated double sampling in accordance with one embodiment of the present invention includes a differential amplifier DA, a number of switches SW1–SW7, two shunt capacitors $C_{H1}$, $C_{H2}$, two buffer amplifiers A1, A2 and a feedback integration capacitor $C_{C2}$, interconnected substantially as shown. The noninverting input of the differential amplifier DA is tied to a dc reference voltage VREF, while the inverting input receives a signal which is the sum of the data input signal INPUT received via a series coupling capacitor $C_{C1}$ and a feedback signal received via the feedback capacitor $C_{C2}$.

The input data signal INPUT originates from a charge sensitive pre-amplifier (not shown) which receives pixel data which is read out from an array in serial form. Such pre-amplifier is reset between each pixel, thereby generating, in addition to the desired image information component, a noise component due to resetting of the pre-amplifier immediately prior to the generating of each pixel signal. During such resetting of the pre-amplifier, switch SW7 is closed in accordance with a clamp control signal CLAMP to discharge the feedback capacitor $C_{C2}$. This results in the feedback loop between the output and inverting input of the differential amplifier DA to be closed, thereby creating a voltage follower circuit. This causes the output of the differential amplifier DA to be equal to the input reference voltage VREF.

Following the resetting of the pre-amplifier, clamping switch SW7 is opened, thereby causing the reset noise to be captured on the input coupling capacitor $C_{C1}$ while allowing the output voltage of the differential amplifier DA to follow the input signal at its inverting input. Additionally, any offset associated with the resetting operation of the pre-amplifier has now also been removed.

In accordance with switch control signals s1–s4, one of the two sample and hold signal paths SH1, SH2 is selected for sampling the output of the differential amplifier DA, while the other path is selected for holding the previously sampled signal level for buffering by its respective buffer amplifier A1/A2 and outputting via its respective output switch SW3/SW4. For example, when sample and hold signal path SH1 is selected, switches SW2 and SW4 are closed and switches SW1 and SW3 are opened and the voltage across hold capacitor $C_{H1}$ tracks the output of the differential amplifier DA. At the end of the tracking time for sample and hold signal path SH1, switches SW2 and SW4 are opened and switches SW1 and SW3 are closed, preferably in that order. At this point, the last value of the output of the differential amplifier DA, minus the pre-amplifier reset noise, is now stored on hold capacitor $C_{H1}$ for buffering by its buffer amplifier A1 and outputting via switch SW3. Meanwhile, the feedback loop through switches SW1 and SW5 is now closed, thereby allowing the voltage across hold capacitor $C_{H2}$ to track the output of the differential amplifier DA.

The above-described clamping, tracking and sampling operation is repeated for the second sampling and hold signal path SH2. Hence, with the exception of those brief periods of time when the feedback capacitor $C_{C2}$ is discharged and the signal switches SW1–SW6 are transitioning between their respective open and closed states, one of the hold capacitors $C_{H1}$, $C_{H2}$ is tracking the input signal (minus its associated reset noise) while the other hold capacitor is providing the immediately preceding sampled pixel information as the output signal OUTPUT. Accordingly, maximum time is available for signal acquisition.

Figure 2:
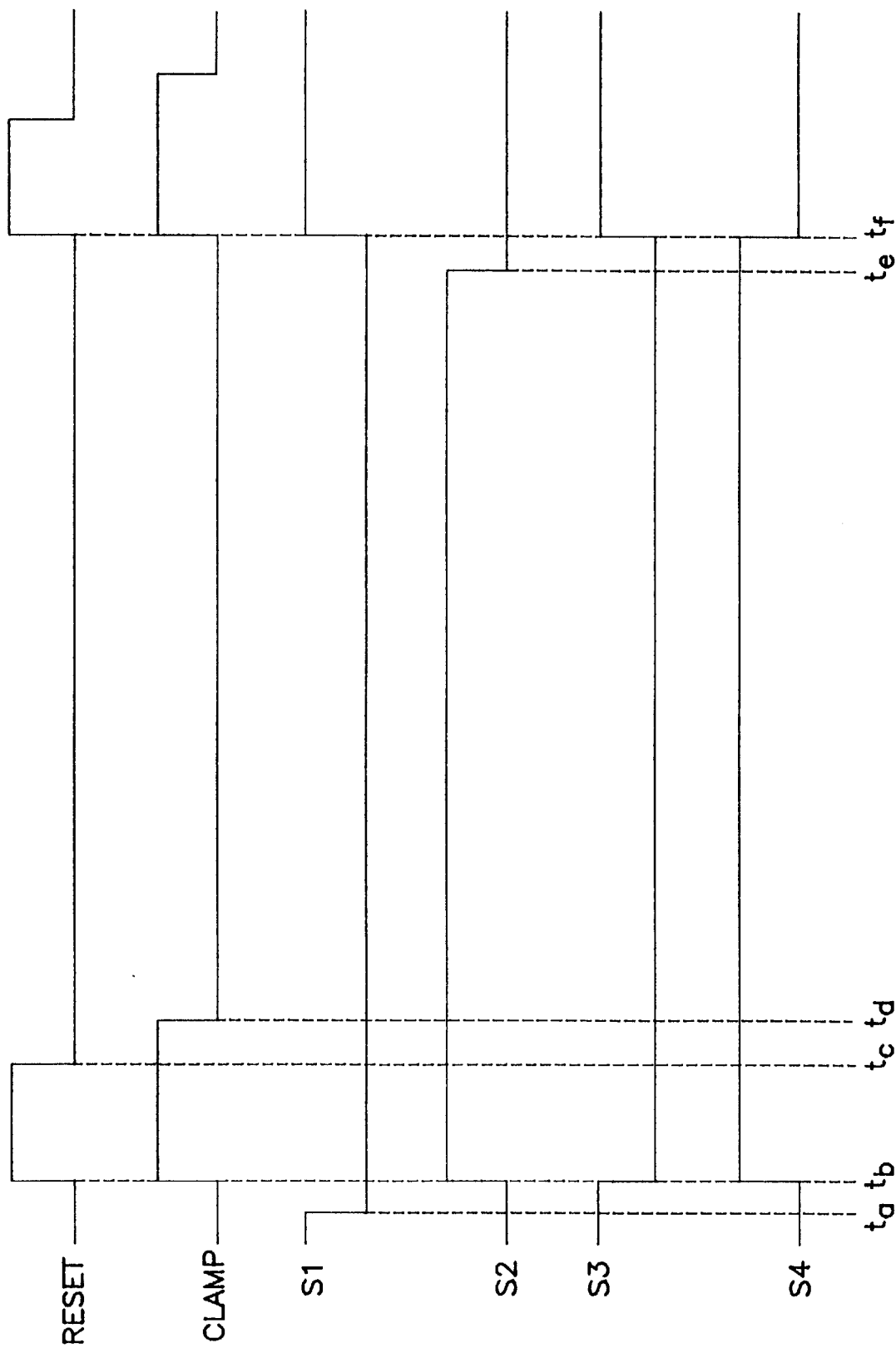
FIG. 2 is a signal timing diagram for the switch control signals of FIG. 1.

Referring to FIG. 2, the relative timing of the above-discussed reset, clamp and switch control signals can be better understood. As discussed above, during a reset of the pre-amplifier (interval $t_b$-$t_c$), the CLAMP signal is asserted to close switch SW7 (interval $t_b$-$t_d$) to discharge the feedback integration capacitor $C_{c2}$. Immediately preceding this (at time $t_a$), switch control signal s1 is de-asserted while, coincidentally with assertion of the CLAMP signal (time $t_b$), switch control signals s2 and s4 are asserted and switch control signal s3 is de-asserted. Accordingly, switches SW2, SW4 and SW6 are closed and switches SW1, SW3 and SW5 are opened.

Subsequently, and immediately preceding the next reset of the pre-amplifier (time $t_a$), switch control signal S2 is de-asserted and, coincidentally with the next resetting of the pre-amplifier, switch control signals S1 and S3 are asserted and switch control signal S4 is de-asserted. Hence, in accordance with the foregoing discussion, sample and hold signal path SH1 is used for tracking the input signal (interval $t_d$-$t_e$) while sample and hold signal path SH2 provides the output signal (interval $t_b$-$t_f$). Immediately thereafter (following time $t_f$), the second sample and hold signal path SH2 follows the input signal, while the first sample and hold signal path SH1 provides the output signal.

Figure 3:
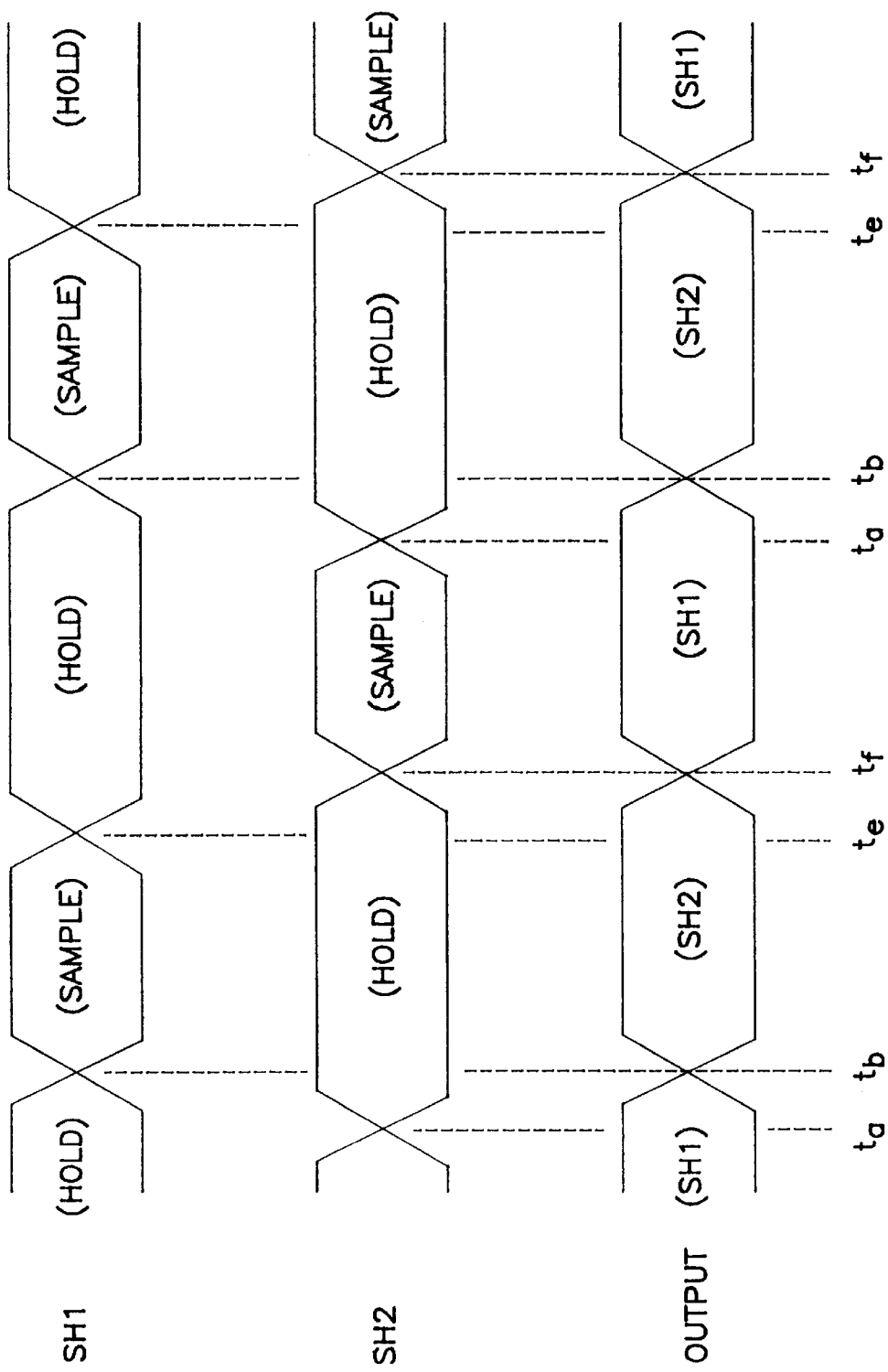
FIG. 3 illustrates the relative timing of the input signals being sampled and held and outputted by the circuit of FIG. 1.

Referring to FIG. 3, the above-discussed simultaneous sampling and holding by the multiple channels of the pipelined sample and hold circuit can be better understood. For example, during the time interval that the first sample and hold signal path SH1 is sampling the input signal INPUT (interval $t_b$-$t_e$), the second sample and hold signal path SH2 is in its hold mode and is providing the output signal OUTPUT. Subsequently, during the time interval that the second sample and hold signal path SH2 is sampling the input signal INPUT (interval $t_f$-$t_a$), the first sample and hold signal path SH1 is in its hold mode and is providing the output signal OUTPUT. Accordingly, temporally adjacent signals within the multiplexed output signal OUTPUT represent temporally adjacent samples of the input signal INPUT. Similarly, temporally coincident signals from the sample and hold signal paths SH1, SH2 also represent temporally adjacent samples of the input signal INPUT.

Figure 1A:
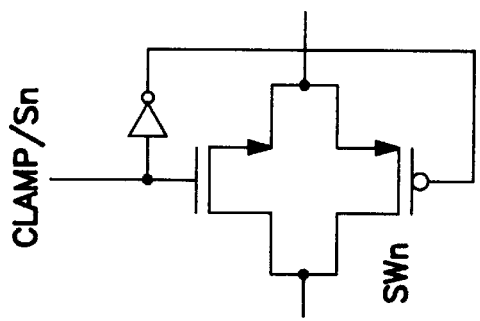
FIG. 1A is a schematic diagram of a transmission gate circuit.

Switches SW1–SW7 have been represented in FIG. 1 as single pole, single throw (SPST) switches. In a preferred embodiment, each of the switches SW1–SW7 is implemented in the form of a transmission gate, as shown in FIG. 1A, which consists of two pass transistors (a P-MOSFET and an N-MOSFET) with common drain terminal and common source terminal connections. However, it should be understood that switches SW1–SW6 can be implemented in other than SPST form. For example, switches SW1 and SW2 together can be implemented as a single pole, double throw (SPDT) switch with the pole connected to the output of the differential amplifier DA and one throw connected to each of the hold capacitors $C_{H1}$, $C_{H2}$.

Similarly, switches SW3 and SW4 together can be implemented as a SPDT switch with the pole connected to the output and each throw connected to an output of one of the buffering amplifiers A1, A2. Further similarly, switches SW5 and SW6 can be implemented as a SPDT switch with the pole connected to capacitor $C_{C2}$ and switch SW7 and each throw connected to an output of one of the buffer amplifiers A1, A2. Alternatively, with appropriate timing adjustments for their respective switch control signals SW1–SW4, each of these switch pairs SW1/SW2, SW3/SW4, SW5/SW6 can also be implemented in the form of a multiplexor.

Figure 4:
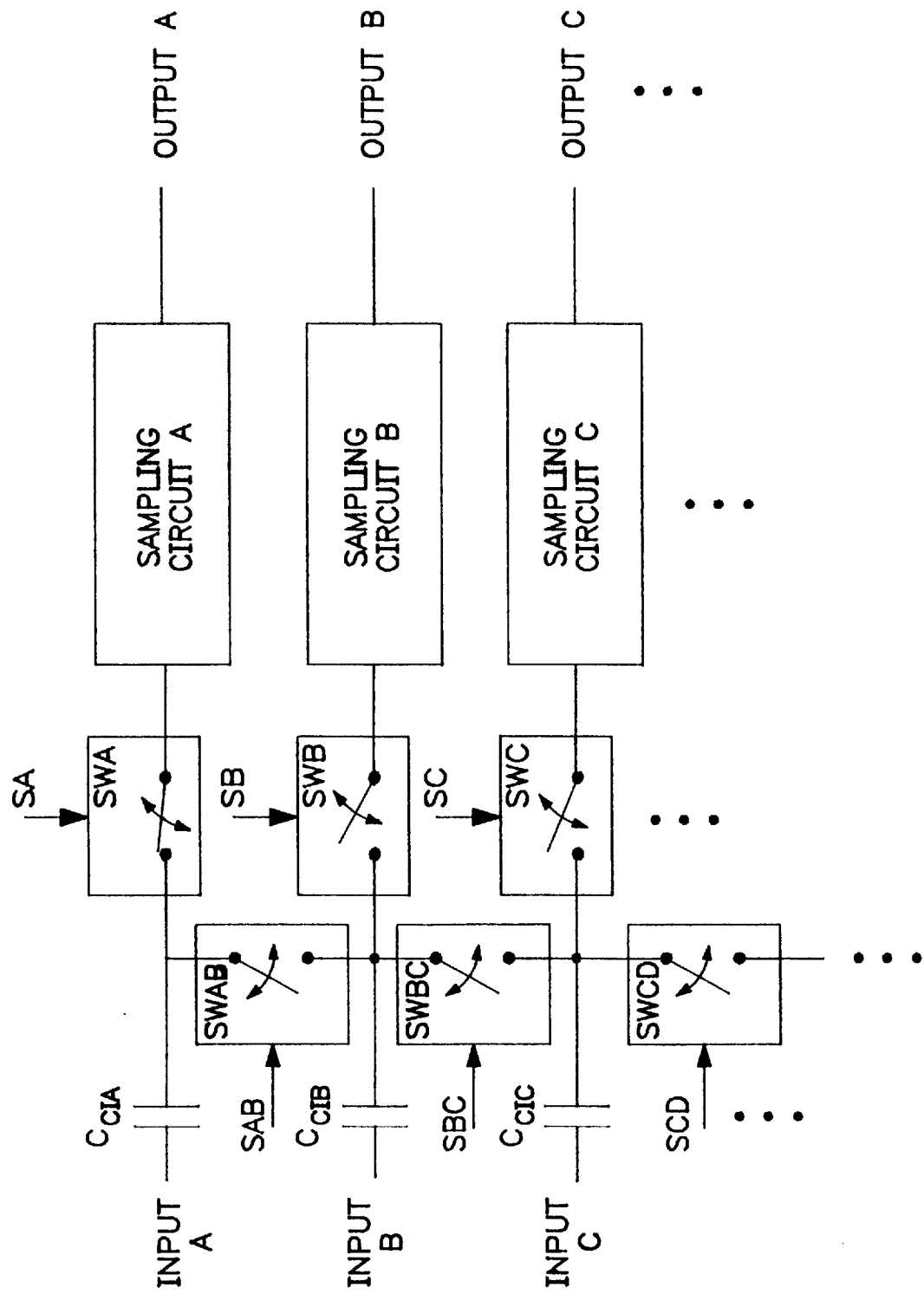
FIG. 4 illustrates how multiple pipelined sample and hold circuits with correlated double sampling can be interconnected for combining, or "binning," data from multiple charge sensitive pre-amplifiers.

Referring to FIG. 4, a number of pipelined sample and hold signals with correlated double circuits in accordance with the present invention can be interconnected via a network of switches SWA, SWB, SWC . . . and SWAB, SWBC, SWCD . . . to provide for combining, or "binning," of input signals A, B, C . . . from multiple pre-amplifiers. The serial input switches SWA, SWB, SWC are used for disconnecting those sampling circuits which are to be disabled during the "binning" mode, while the shunting input switches SWAB, SWBC, SWCD . . . are used for selectively interconnecting the input channels A, B, . . . to the sampling circuit to be used in the binning mode. Cancellation of the pre-amplifier reset noise occurs as discussed above, but through one sampling circuit instead of multiple sampling circuits.

Accordingly, for example, for binning signals from two channels (A and B), switches SWA, SWB and SWAB would be closed and input signals A and B would be coupled into sampling circuit A via their respective input coupling capacitors $C_{C1a}$ and $C_{C1b}$, while switches SWB, SWC, SWBC and SWCD would be open. As should be evident, this binning technique can be extended to any number of channels.

Various other modifications and alterations in the structure and method of operation of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a signal sampling circuit for performing correlated double sampling (CDS) of an input signal with a pipelined sample and hold architecture, said signal sampling circuit comprising:

a capacitive input circuit configured to receive said input signal and in accordance therewith provide a capacitively coupled input signal, wherein said input signal includes first and second input signal values during alternating first and second time periods, respectively;

a differential amplifier, coupled to said capacitive input circuit and including first and second input terminals and an output terminal, configured to receive said capacitively coupled input signal, a feedback signal and a reference voltage via said first and second differential amplifier input terminals and in accordance therewith provide an amplified signal via said differential amplifier output terminal;

a pipelined sample and hold circuit, coupled to said differential amplifier output terminal, configured to receive a plurality of sampling control signals and in accordance therewith receive, sample and hold said amplified signal and in accordance therewith provide first and second pluralities of time multiplexed signal samples, wherein respective temporally adjacent ones of said first and second pluralities of time multiplexed signal samples and temporally coincident ones of said first and second pluralities of time multiplexed signal samples represent temporally adjacent samples of said input signal; and a capacitive feedback circuit, coupled between said pipelined sample and hold circuit and said first differential amplifier input terminal, configured to receive said first plurality of time multiplexed signal samples and a feedback control signal which includes first and second control signal states during said first and second time periods, respectively, and in accordance therewith provide said feedback signal, wherein said capacitive feedback circuit comprises a capacitor configured to alternately charge and discharge, wherein said capacitor charging is in accordance with said first plurality of time multiplexed signal samples, and a switch, coupled across said capacitor, configured to receive said feedback control signal and in accordance therewith alternately allow said charging and cause said discharging of said capacitor;

wherein each one of said first and second pluralities of time multiplexed signal samples contains first and second signal samples which represent said reference voltage and said second input signal values during said first and second time periods, respectively.

2. The apparatus of claim 1, wherein:

said first and second input terminals of said differential amplifier comprise inverting and noninverting input terminals of said differential amplifier, respectively; and said differential amplifier, said pipelined sample and hold circuit and said capacitive feedback circuit together comprise a time multiplexed integrating amplifier circuit.

3. A method of performing correlated double sampling (CDS) of an input signal with pipelined sampling and holding, said method comprising the steps of:

(a) receiving and capacitively coupling said input signal and in accordance therewith generating a capacitively coupled input signal, wherein said input signal includes first and second input signal values during alternating first and second time periods, respectively;

(b) receiving said capacitively coupled input signal, a feedback signal and a reference voltage via said first and second differential amplifier input terminals and in accordance therewith generating an amplified signal via an output terminal of said differential amplifier;

(c) receiving a plurality of sampling control signals and in accordance therewith sampling and holding said amplified signal and in accordance therewith generating first and second pluralities of time multiplexed signal samples, wherein respective temporally adjacent ones of said first and second pluralities of time multiplexed signal samples and temporally coincident ones of said first and second pluralities of time multiplexed signal samples represent temporally adjacent samples of said input signal; and (d) receiving a feedback control signal which includes first and second control signal states during said first and second time periods, respectively, and in accordance therewith capacitively coupling said first plurality of time multiplexed signal samples to said first differential amplifier input terminal as said feedback signal by charging a capacitor in accordance with said first plurality of time multiplexed input signal samples, and discharging said capacitor in accordance with said feedback control signal, wherein each one of said first and second pluralities of time multiplexed signal samples contains first and second signal samples which represent said reference voltage and said second input signal values during said first and second time periods, respectively.

4. The method claim 3, wherein said steps (b), (c) and (d) together comprise a method of performing a time multiplexed integration of said input signal.

5. An apparatus including a signal sampling circuit for performing correlated double sampling (CDS) of an input signal with a pipelined sample and hold architecture, said signal sampling circuit comprising:

a capacitive input circuit configured to receive said input signal and in accordance therewith provide a capacitively coupled input signal, wherein said input signal includes an image information component and a noise component;

a differential amplifier, coupled to said capacitive input circuit and including first and second input terminals and an output terminal, configured to receive said capacitively coupled input signal and a reference voltage via said first and second differential amplifier input terminals, respectively, and in accordance therewith provide an amplified signal via said differential amplifier output terminal;

a pipelined sample and hold circuit, coupled to said differential amplifier output terminal, configured to receive a plurality of sampling control signals and in accordance therewith receive, sample and hold said amplified signal and in accordance therewith provide first and second pluralities of time multiplexed signal samples, wherein respective temporally adjacent ones of said first and second pluralities of time multiplexed signal samples and temporally coincident ones of said first and second pluralities of time multiplexed signal samples represent temporally adjacent samples of said input signal, and wherein said pipelined sample and hold circuit includes a first signal selector circuit configured to receive a first portion of said plurality of sampling control signals and in accordance therewith receive and sample said amplified signal and in accordance therewith provide a plurality of samples of said amplified signal, a plurality of shunt capacitors, coupled to said first signal selector circuit, configured to receive said plurality of samples of said amplified signal and in accordance therewith provide a plurality of held samples of said amplified signal, and a second signal selector circuit, coupled to said plurality of shunt capacitors, configured to receive a second portion of said plurality of sampling control signals and in accordance therewith receive and select among said held samples of said amplified signal and in accordance therewith provide said first and second pluralities of time multiplexed signal samples; and a capacitive feedback circuit, coupled between said pipelined sample and hold circuit and said first differential amplifier input terminal, configured to receive a feedback control signal and in accordance therewith receive said first plurality of time multiplexed signal samples, wherein said first and second pluralities of time multiplexed signal samples include said image information component and exclude said noise component.

6. The apparatus of claim 3, wherein said first and second signal selector circuits comprise first and second pluralities of pass transistors.

7. An apparatus including a signal sampling circuit for performing correlated double sampling (CDS) of an input signal with a pipelined sample and hold architecture, said signal sampling circuit comprising:

a capacitive input circuit configured to receive said input signal and in accordance therewith provide a capacitively coupled input signal, wherein said input signal includes an image information component and a noise component;

a differential amplifier, coupled to said capacitive input circuit and including first and second input terminals and an output terminal, configured to receive said capacitively coupled input signal and a reference voltage via said first and second differential amplifier input terminals, respectively, and in accordance therewith provide an amplified signal via said differential amplifier output terminal;

a pipelined sample and hold circuit, coupled to said differential amplifier output terminal, configured to receive one or more sampling control signals and in accordance therewith receive, sample and hold said amplified signal and in accordance therewith provide a plurality of signal samples and to time multiplex said plurality of signal samples and in accordance therewith provide a first plurality of time multiplexed signal samples, wherein temporally coincident ones of said plurality of signal samples and temporally adjacent ones of said first plurality of time multiplexed signal samples represent temporally adjacent samples of said input signal, and wherein said pipelined sample and hold circuit includes a first signal selector circuit configured to receive a first portion of said one or more sampling control signals and in accordance therewith receive and sample said amplified signal and in accordance therewith provide a plurality of samples of said amplified signal, a plurality of shunt capacitors, coupled to said first signal selector circuit, configured to receive said plurality of samples of said amplified signal and in accordance therewith provide a plurality of held samples of said amplified signal, and a second signal selector circuit, coupled to said plurality of shunt capacitors, configured to receive a second portion of said one or more sampling control signals and in accordance therewith receive and select among said held samples of said amplified signal and in accordance therewith provide said first plurality of time multiplexed signal samples; and a capacitive switching feedback circuit, coupled between said pipelined sample and hold circuit and said first differential amplifier input terminal, configured to receive a plurality of feedback control signals and said plurality of signal samples and in accordance therewith time multiplex said plurality of signal samples and in accordance therewith provide a second plurality of time multiplexed signal samples and to charge and discharge in accordance therewith, wherein said first and second pluralities of time multiplexed signal samples include said image information component and exclude said noise component.

8. The apparatus of claim 7, wherein said first and second signal selector circuits comprise first and second pluralities of pass transistors.

9. An apparatus including a signal sampling circuit for performing correlated double sampling (CDS) of an input signal with a pipelined sample and hold architecture, said signal sampling circuit comprising:

a capacitive input circuit configured to receive said input signal and in accordance therewith provide a capacitively coupled input signal, wherein said input signal includes an image information component and a noise component;

a differential amplifier, coupled to said capacitive input circuit and including first and second input terminals and an output terminal, configured to receive said capacitively coupled input signal and a reference voltage via said first and second differential amplifier input terminals, respectively, and in accordance therewith provide an amplified signal via said differential amplifier output terminal;

a pipelined sample and hold circuit, coupled to said differential amplifier output terminal, configured to receive one or more sampling control signals and in accordance therewith receive, sample and hold said amplified signal and in accordance therewith provide a plurality of signal samples and to time multiplex said plurality of signal samples and in accordance therewith provide a first plurality of time multiplexed signal samples, wherein temporally coincident ones of said plurality of signal samples and temporally adjacent ones of said first plurality of time multiplexed signal samples represent temporally adjacent samples of said input signal; and a capacitive switching feedback circuit, coupled between said pipelined sample and hold circuit and said first differential amplifier input terminal, configured to receive a plurality of feedback control signals and said plurality of signal samples and in accordance therewith time multiplex said plurality of signal samples and in accordance therewith provide a second plurality of time multiplexed signal samples and to charge and discharge in accordance therewith, wherein said first and second pluralities of time multiplexed signal samples include said image information component and exclude said noise component, and wherein said capacitive switching feedback circuit includes a signal selector circuit configured to receive a first portion of said plurality of feedback control signals and in accordance therewith receive and time multiplex said plurality of signal samples and in accordance therewith provide said second plurality of time multiplexed signal samples, a capacitor, coupled to said signal selector circuit, configured to receive said second plurality of time multiplexed signal samples and alternately charge and discharge, wherein said capacitor charging is in accordance with said second plurality of time multiplexed signal samples, and a switch, coupled across said capacitor, configured to receive a second portion of said plurality of feedback control signals and in accordance therewith alternately allow said charging and cause said discharging of said capacitor.

10. The apparatus of claim 9, wherein said third signal selector circuit comprises a plurality of pass transistors.

11. A method of performing correlated double sampling (CDS) of an input signal with pipelined sampling and holding, said method comprising the steps of:

(a) receiving and capacitively coupling said input signal and in accordance therewith generating a capacitively coupled input signal, wherein said input signal includes an image information component and a noise component;

(b) receiving said capacitively coupled input signal and a reference voltage via first and second input terminals, respectively, of a differential amplifier and in accordance therewith generating an amplified signal via an output terminal of said differential amplifier;

(c) receiving a plurality of sampling control signals and in accordance therewith sampling and holding said amplified signal and in accordance therewith generating first and second pluralities of time multiplexed signal samples, wherein respective temporally adjacent ones of said first and second pluralities of time multiplexed signal samples and temporally coincident ones of said first and second pluralities of time multiplexed signal samples represent temporally adjacent samples of said input signal, and wherein said step (c) includes receiving a first portion of said plurality of sampling control signals and in accordance therewith sampling said amplified signal and in accordance therewith generating a plurality of samples of said amplified signal, capacitively holding said plurality of samples of said amplified signal and in accordance therewith generating a plurality of held samples of said amplified signal, and receiving a second portion of said plurality of sampling control signals and in accordance therewith selecting among said held samples of said amplified signal and in accordance therewith generating said first and second pluralities of time multiplexed signal samples; and (d) receiving a feedback control signal and in accordance therewith capacitively coupling said first plurality of time multiplexed signal samples to said first differential amplifier input terminal, wherein said first and second pluralities of time multiplexed signal samples include said image information component and exclude said noise component.

12. A method of performing correlated double sampling (CDS) of an input signal with pipelined sampling and holding, said method comprising the steps of:

(a) receiving and capacitively coupling said input signal and in accordance therewith generating a capacitively coupled input signal, wherein said input signal includes an image information component and a noise component;

(b) receiving said capacitively coupled input signal and a reference voltage via first and second input terminals, respectively, of a differential amplifier and in accordance therewith generating an amplified signal via an output terminal of said differential amplifier;

(c) receiving one or more sampling control signals and in accordance therewith sampling and holding said amplified signal and in accordance therewith generating a plurality of signal samples, wherein temporally coincident ones of said plurality of signal samples represent temporally adjacent samples of said input signal, and wherein said step (c) includes receiving a first portion of said one or more sampling control signals and in accordance therewith sampling said amplified signal and in accordance therewith generating a plurality of samples of said amplified signal, and capacitively holding said plurality of samples of said amplified signal and in accordance therewith generating a plurality of held samples of said amplified signal;

(d) time multiplexing said plurality of signal samples and in accordance therewith generating a first plurality of time multiplexed signal samples, wherein temporally adjacent ones of said first plurality of time multiplexed signal samples represent temporally adjacent samples of said input signal, and wherein said step (d) includes receiving a second portion of said one or more sampling control signals and in accordance therewith selecting among said held samples of said amplified signal and in accordance therewith generating said first plurality of time multiplexed signal samples;

(e) receiving a first portion of a plurality of feedback control signals and in accordance therewith time multiplexing said plurality of signal samples and in accordance therewith generating a second plurality of time multiplexed signal samples; and (f) receiving a second portion of said plurality of feedback control signals and in accordance therewith capacitively coupling said second plurality of time multiplexed signal samples to said first differential amplifier input terminal, wherein said first and second pluralities of time multiplexed signal samples include said image information component and exclude said noise component.

13. A method of performing correlated double sampling (CDS) of an input signal with pipelined sampling and holding, said method comprising the steps of:

(a) receiving and capacitively coupling said input signal and in accordance therewith generating a capacitively coupled input signal, wherein said input signal includes an image information component and a noise component;

(b) receiving said capacitively coupled input signal and a reference voltage via first and second input terminals, respectively, of a differential amplifier and in accordance therewith generating an amplified signal via an output terminal of said differential amplifier;

(c) receiving one or more sampling control signals and in accordance therewith sampling and holding said amplified signal and in accordance therewith generating a plurality of signal samples, wherein temporally coincident ones of said plurality of signal samples represent temporally adjacent samples of said input signal;

(d) time multiplexing said plurality of signal samples and in accordance therewith generating a first plurality of time multiplexed signal samples, wherein temporally adjacent ones of said first plurality of time multiplexed signal samples represent temporally adjacent samples of said input signal;

(e) receiving a first portion of a plurality of feedback control signals and in accordance therewith time multiplexing said plurality of signal samples and in accordance therewith generating a second plurality of time multiplexed signal samples; and (f) receiving a second portion of said plurality of feedback control signals and in accordance therewith capacitively coupling said second plurality of time multiplexed signal samples to said first differential amplifier input terminal, wherein said first and second pluralities of time multiplexed signal samples include said image information component and exclude said noise component, and wherein said step (f) includes charging a capacitor in accordance with said second plurality of time multiplexed signal samples, and discharging said capacitor in accordance with said second portion of said plurality of feedback control signals.

* * * * *